(12) United States Patent
Yeh et al.

(10) Patent No.: US 8,487,575 B2
(45) Date of Patent: Jul. 16, 2013

(54) ELECTRIC MOTOR STATOR WINDING TEMPERATURE ESTIMATION

(75) Inventors: Chia-Chou Yeh, Gardena, CA (US); Nitinkumar R. Patel, Cypress, CA (US); Yo Chan Son, Torrance, CA (US); Steven E. Schulz, Torrance, CA (US)

(73) Assignee: GM Global Technology Operations LLC, Detroit, MI (US)

(*) Notice: Subject to any disclaimer, the term of this patent is extended or adjusted under 35 U.S.C. 154(b) by 665 days.

(21) Appl. No.: 12/568,002

(22) Filed: Sep. 28, 2009

(65) Prior Publication Data

US 2011/0050141 A1 Mar. 3, 2011

Related U.S. Application Data

(60) Provisional application No. 61/238,570, filed on Aug. 31, 2009.

(51) Int. Cl.
*G05D 23/00* (2006.01)

(52) U.S. Cl.
USPC ............ 318/471; 318/472; 318/432; 318/799

(58) Field of Classification Search
USPC .................. 318/268, 432, 434, 469, 471, 634, 318/641, 799, 814, 822, 823, 472, 473, 727
See application file for complete search history.

(56) References Cited

U.S. PATENT DOCUMENTS

| | | | |
|---|---|---|---|
| 4,958,116 A | 9/1990 | Hirose | |
| 5,043,649 A * | 8/1991 | Murakami et al. | 318/696 |
| 5,144,216 A | 9/1992 | De Doncker | |
| 5,334,923 A | 8/1994 | Lorenz et al. | |
| 5,936,820 A * | 8/1999 | Umemura et al. | 361/103 |
| 6,433,506 B1 | 8/2002 | Pavlov et al. | |
| 6,683,428 B2 | 1/2004 | Pavlov et al. | |
| 6,854,881 B2 * | 2/2005 | Nada | 374/169 |
| 6,870,348 B2 | 3/2005 | Mijalkovic et al. | |
| 7,560,895 B2 | 7/2009 | Arnet | |

(Continued)

FOREIGN PATENT DOCUMENTS

| CN | 101261162 A | 9/2008 |
|---|---|---|
| CN | 201281637 Y | 7/2009 |

OTHER PUBLICATIONS

Mellor, PH, et al. "Lumped parameter thermal model for electrical machines of TEFC design," IEEE Proceedings on Electric Power Applications, Sep. 1991, pp. 205-218, vol. 138, No. 5.

(Continued)

*Primary Examiner* — Antony M Paul
(74) *Attorney, Agent, or Firm* — Ingrassia Fisher & Lorenz, P.C.

(57) ABSTRACT

A temperature estimation controller and methods are provided for estimating stator winding temperature over a full range of motor operating speeds. In one implementation, the angular velocity of a motor is determined along with a total power loss for each phase of said motor. The total power loss in each phase comprises stator winding power loss and a core power loss. Stator winding temperatures for each phase of motor can then estimated based on the total power loss in that phase, and a combined thermal impedance for that phase. The combined thermal impedance comprises a first thermal impedance between the stator winding and the stator core, and a second thermal impedance between the stator core and the motor coolant.

13 Claims, 6 Drawing Sheets

U.S. PATENT DOCUMENTS

| | | | |
|---|---|---|---|
| 7,570,074 B2 * | 8/2009 | Gao et al. | 324/765.01 |
| 7,615,951 B2 * | 11/2009 | Son et al. | 318/432 |
| 7,746,013 B2 * | 6/2010 | Fernengel et al. | 318/400.07 |
| 8,013,565 B2 * | 9/2011 | Miura | 318/811 |
| 8,069,827 B2 | 12/2011 | Watanabe et al. | |
| 2009/0066283 A1 | 3/2009 | Son et al. | |
| 2009/0189561 A1 | 7/2009 | Patel | |
| 2010/0194329 A1 * | 8/2010 | Lu et al. | 318/798 |
| 2011/0050141 A1 | 3/2011 | Yeh et al. | |

OTHER PUBLICATIONS

Asaii, B., et al. "A new thermal model for EV induction machine drives," IEEE Power Electronics in Transportation, Oct. 1996, pp. 175-182.

Gao, Z., et al. "A sensorless adaptive stator winding temperature estimator for mains-fed induction machines with continuous-operation periodic duty cycles," IEEE Transactions on Industry Applications, Sep./Oct. 2008, pp. 1533-1542, vol. 44, No. 5.

Briz, F., et al. "Temperature estimation in inverter-fed machines using high-frequency carrier signal injection," IEEE Transactions on Industry Applications, May/Jun. 2008, pp. 799-808, vol. 44, No. 3.

Al-Tayie, J.K., et al. "Estimation of speed, stator temperature and rotor temperature in cage induction motor drive using the extended kalman filter algorithm," IEEE Proceedings in Electric Power Applications, Sep. 1997, pp. 301-309, vol. 144, No. 5.

Chinese Patent & Trademark Office. Chinese Office Action dated Jan. 5, 2013 for Application No. 201010587665.9.

U.S. Notice of Allowance, dated Aug. 8, 2012, for U.S. Appl. No. 12/784,873.

U.S. Office Action, dated Aug. 9, 2012, for U.S. Appl. No. 12/635,313.

U.S. Ex Parte Quayle Action, dated Sep. 20, 2012, for U.S. Appl. No. 12/778,733.

Chinese Patent & Trademark Office. Chinese Office Action dated Dec. 21, 2012 for Application No. 201010269361.8.

Chinese Patent & Trademark Office. Chinese Office Action dated Jan. 30, 2013 for Application No. 201110122349.9.

* cited by examiner

ELECTRIC MOTOR STATOR WINDING TEMPERATURE ESTIMATION

CROSS-REFERENCE TO RELATED APPLICATION

This application claims the benefit of U.S. Provisional Application No. 61/238,570, filed Aug. 31, 2009.

TECHNICAL FIELD

The present invention generally relates to electric motor systems, and more particularly relates to a method and an apparatus for estimating the temperature of stator windings in an electric motor.

BACKGROUND

Hybrid and electric vehicles (HEVs) typically include an alternating current (AC) electric motor which is driven by a direct current (DC) power source, such as a storage battery. Stator windings of the AC electric motor can be coupled to a power inverter module that performs a rapid switching function to convert the DC power to AC power to drive the AC electric motor, which in turn drives a shaft of HEV's drivetrain. The temperature of motor stator windings is an important parameter since it can be used for a variety of purposes. For example, stator winding temperature can be an important parameter in various motor control algorithms that utilize stator resistance as a control variable because stator winding resistance is temperature dependent and can be adjusted based on temperature.

Stator winding temperature can also be used to detect high motor temperatures to prevent overheating. Typically, the temperature of the stator windings is measured by a temperature measurement sensor, such as a thermistor or thermocouple that is installed or mounted on one of the electric motor's stator windings. If the three phase currents that flow in the stator windings are balanced, a single temperature measurement sensor can sometimes be used adequately to estimate the temperature of all of the stator windings. However, in some systems, there may be a very large temperature gradient between the temperature sensor and the hot spot of the stator winding. In this situation, using the single temperature sensor to predict the motor hot spot temperature becomes difficult. Additionally, at zero speed, no current may be flowing in one of the stator windings where the sensor is installed or, at certain speeds, unbalanced currents may be flowing in one of the stator windings. For example, during a stall condition, one phase may carry a current equivalent to the peak of the sine wave current, while the other two phases carry one half the current with opposite sign. Hence, one phase may experience four times (4×) the resistive heating losses compared to the other two phases. Under these conditions, the single temperature measurement sensor will not correctly generate the actual temperature of the electric motor and, consequently, the electric motor can be damaged by overheating.

Another drawback is that such temperature sensors can be expensive, unreliable and can require maintenance or servicing. Each sensor adds extra cost to the system, and in some cases it is necessary to employ multiple sensors in the motor to identify the hottest spot of the stator windings. In addition, the sensors require external electrical signal conditioning circuitry to process the sensor signal(s), which further increases cost of the system and potentially reduces system reliability even further. In addition, they need to be serviced and maintained to ensure that they are operating as intended. Moreover, when sensors fail they must be repaired or replaced which can be a challenge since they are usually located inside the motor, for example, in the middle of a stator slot.

To reduce the number of temperature sensors or even completely eliminate the need for sensors, sensorless stator winding temperature estimation techniques have also been developed. Some sensorless stator winding temperature estimation techniques employ complex motor thermal models computed based on machine geometry and its thermal and electrical properties. While these techniques can provide accurate and robust temperature estimation, they require development of a complex motor thermal model. In many cases, information regarding the motor geometry and/or its thermal or electrical properties may not be readily available.

In addition, a high-frequency carrier signal injection technique has also been used for stator temperature estimation; however, this technique assumes that the stator and rotor temperatures are identical, which is not always the case. As such, the accuracy declines as the stator and rotor temperatures drift apart.

Other sensorless stator winding temperature estimation techniques have also been developed that work well for zero or low speed temperature estimation (e.g., below 75 rpm); however, these techniques do not yield accurate estimation results at higher motor speeds.

Accordingly, it is desirable to provide a method, system and apparatus for estimating stator winding temperature over the entire motor operating speed range (i.e., low operating speeds and high operating speeds). It would also be desirable to completely eliminate the need for any stator winding temperature sensors. In addition, it is desirable to provide a method, system and apparatus for estimating stator winding temperature that works at all motor operating speeds (i.e., rotor angular velocities) without using a temperature sensor (e.g., thermistor) coupled to one or more of the stator windings. Furthermore, other desirable features and characteristics of the present invention will become apparent from the subsequent detailed description and the appended claims, taken in conjunction with the accompanying drawings and the foregoing technical field and background.

SUMMARY

In accordance with one exemplary embodiment, a sensorless temperature estimation controller and methods are provided that can estimate stator winding temperature over a full range of motor operating speeds. When motor speed is below a speed threshold (e.g., 75 rpm), a first set of estimated stator winding temperatures for each of a stator windings can be estimated based a first set of thermal impedance models that include stator winding power losses. However, when motor speed is above the speed threshold, a second set of estimated stator winding temperatures for each of the stator windings is estimated based a second set of thermal impedance models that include stator winding power losses and core power losses.

In accordance with another embodiment, a system and method are provided for controlling a torque command in a vector controlled motor drive system. When a detected motor speed is greater than a predetermined speed, the stator winding temperature for each of the stator windings is estimated based on a total power loss between that stator winding and motor coolant. The total power loss comprises stator winding power loss and core/iron power loss. The value of the torque command is then derated/adjusted in response to the estimated stator winding temperature of one or more of the stator windings in order to protect the motor from overheating.

To estimate the stator winding temperature for each of the stator windings, a stator winding resistance for each stator winding is determined based on a temperature of that stator winding, and used along with an alternating current (AC) root mean square (RMS) stator current to determine a stator winding power loss in each phase. In other words, the stator winding power loss in each phase can be determined based on the stator winding resistance for each phase and an alternating current (AC) root mean square (RMS) stator current that is representative of stator currents in each of the stator windings.

The total power loss in each phase of the motor can then be determined based on said stator winding power loss for that phase and a core power loss. To do so, a plurality of lookup tables are provided. Each lookup table corresponds to a particular DC bus voltage, and specifies values of core power loss for different combinations of motor speed and root-mean-square (RMS) stator winding current. The core power loss can be determined by selecting two lookup tables from the plurality of lookup tables based on a DC bus voltage input, inputting the motor speed and the stator winding current into a first one of the selected lookup tables to compute a first core power loss value, inputting the motor speed and the stator winding current into a second one of the selected lookup tables to compute a second core power loss value, and performing a linear interpolation based on the DC bus voltage, the first core power loss value, and the second core power loss value to compute the core power loss.

A thermal impedance model for each phase characterizes the total power loss between that stator winding and motor coolant. The thermal impedance model generates a change in temperature between the stator winding temperature for that phase and the motor coolant temperature based on the total power loss in that phase and the motor speed.

Stator winding temperatures for each of the stator windings can be estimated based on the thermal impedance models, motor speed, and the motor coolant temperature.

DESCRIPTION OF THE DRAWINGS

The present invention will hereinafter be described in conjunction with the following drawing figures, wherein like numerals denote like elements.

DETAILED DESCRIPTION OF AN EXEMPLARY EMBODIMENT

Figure 1:
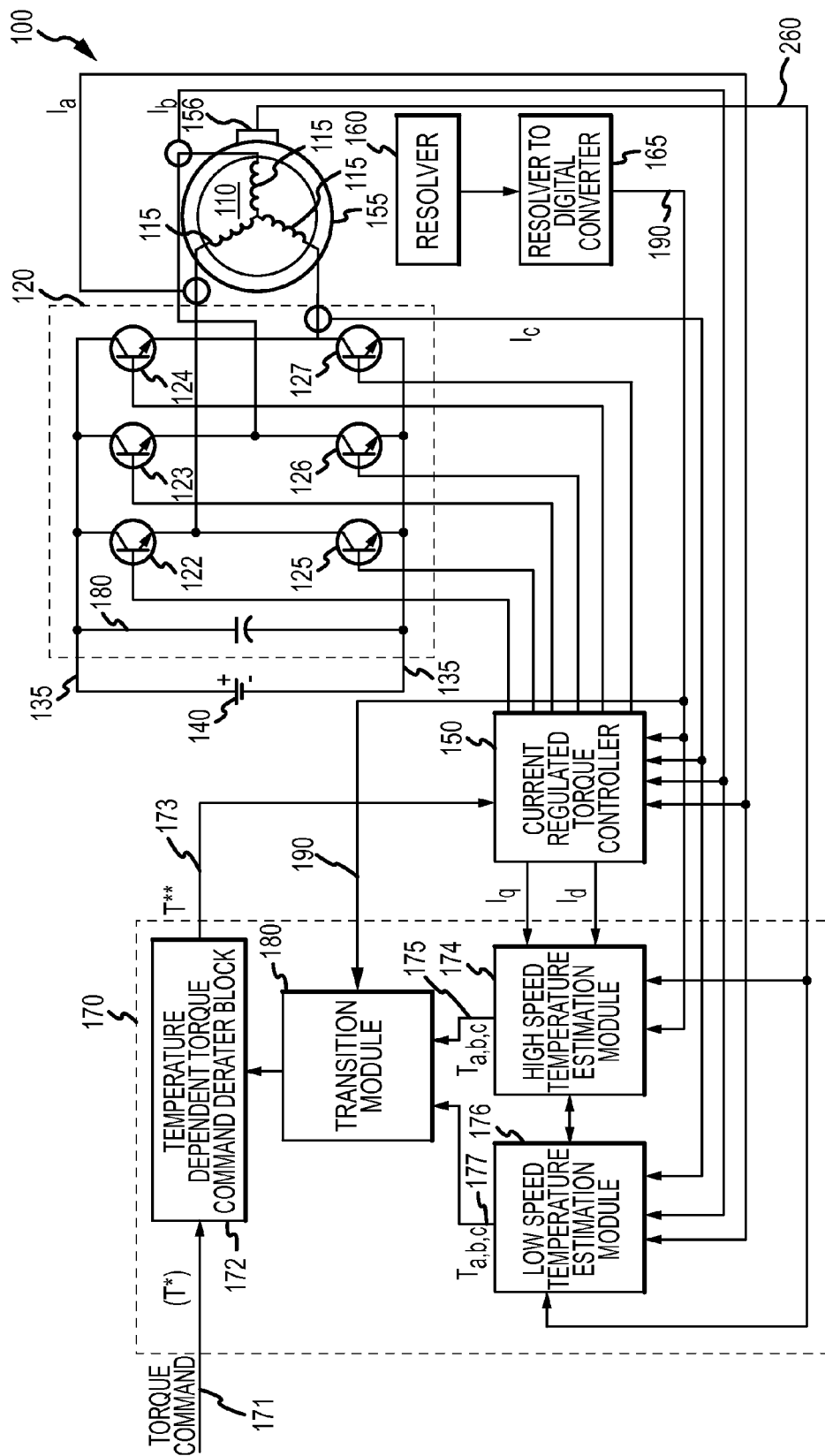
FIG. 1 illustrates a block diagram of an electric motor system in accordance with an embodiment of the present invention.

As used herein, the word "exemplary" means "serving as an example, instance, or illustration." The following detailed description is merely exemplary in nature and is not intended to limit the invention or the application and uses of the invention. Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary or the following detailed description.

Before describing in detail embodiments that are in accordance with the present invention, it should be observed that the embodiments reside primarily in combinations of method steps and apparatus components related to estimating temperature of stator windings in an electrical motor. It will be appreciated that embodiments of the invention described herein can be implemented using hardware, software or a combination thereof. The control circuits described herein may comprise various components, modules, circuits and other logic which can be implemented using a combination of analog and/or digital circuits, discrete or integrated analog or digital electronic circuits or combinations thereof. As used herein the term "module" refers to a device, a circuit, an electrical component, and/or a software based component for performing a task. In some implementations, the control circuits described herein can be implemented using one or more application specific integrated circuits (ASICs), one or more microprocessors, and/or one or more digital signal processor (DSP) based circuits when implementing part or all of the control logic in such circuits. It will be appreciated that embodiments of the invention described herein may be comprised of one or more conventional processors and unique stored program instructions that control the one or more processors to implement, in conjunction with certain non-processor circuits, some, most, or all of the functions for estimating temperature of stator windings in an electrical motor, as described herein. As such, these functions may be interpreted as steps of a method for estimating temperature of stator windings in an electrical motor. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Overview

Embodiments of the present invention relate to methods and apparatus for estimating temperature of stator windings in an electrical motor. The disclosed methods and apparatus can be implemented in operating environments where it is necessary to estimate temperature of stator windings in an electrical motor. In the exemplary implementations which will now be described, the control techniques and technologies will be described as applied to a hybrid and electric vehicle power system that is part of a hybrid/electric vehicle (HEV).

FIG. 1 illustrates a simplified block diagram of a three-phase electric motor drive system 100 architecture that can be implemented in a hybrid/electric vehicle (HEV). In this embodiment, the system 100 can be used to control a three-phase AC motor 110 via a three-phase pulse width modulated (PWM) inverter module 120 connected to the three-phase AC motor 110 by adjusting current commands that control the three-phase AC motor 110.

The electric motor system 100 in accordance with an embodiment of the present invention includes a three-phase alternating current (AC) synchronous electric machine 110, which operates in response to signals from an inverter 120. As used herein, the term AC motor refers to an electric motor that is driven by an alternating current (AC). An AC motor includes an outside stationary stator having coils supplied with alternating current to produce a rotating magnetic field, and an inside rotor attached to the output shaft that is given a torque by the rotating field. The three-phase AC motor 110 can be a three-phase AC-powered "wound" motor such as a permanent magnet synchronous motor with a stator wound into definite poles, a three-phase induction motor or a synchronous reluctance motor. In implementations where the AC machine is a permanent magnet synchronous AC motor this should be understood to encompass Interior Permanent Magnet motors. Although not shown, the motor 110 is coupled to a drive shaft of an HEV.

The three-phase motor 110 includes a rotor (not shown) and three stator windings 115 connected between motor terminals A, B, and C. As illustrated in FIG. 1, the three-phase AC motor 110 has three motor windings 115 that are coupled together at a neutral point.

The three-phase PWM inverter module 120 includes a capacitor 180 and three inverter sub-modules. In this embodiment, one inverter sub-module 115 is coupled to motor winding 115, another inverter sub-module is coupled to motor winding 115, and another inverter sub-module is coupled to motor winding 115. Each inverter sub-module includes a dual switching device. Each dual switching device includes two switches (e.g., a transistor such as Insulated Gate Bipolar Transistor (IGBT) or thyristor) that ideally operate in an alternating manner. For example, the inverter 120 includes a capacitor 180, a first inverter sub-module comprising a dual switch 122/125, a second inverter sub-module comprising a dual switch 123/126, and a third inverter sub-module comprising a dual switch 124/127. As such, full-wave bridge inverter 120 has six solid state switching devices 122, 125, 123, 126, 124, 127 and six diodes (not shown) in antiparallel with each switch to appropriately switch an input voltage and provide three-phase energization of the stator windings 115 of the three-phase AC motor 110.

The three-phase PWM inverter module 120 is connected between direct current (DC) bus lines 135 of a DC power source 140 (e.g., a battery or batteries or other fuel cell) via a high voltage DC bus) and receives a DC input voltage (Vdc). The three-phase PWM inverter module 120 includes a plurality of inverter poles including a first inverter pole that generates a three-phase sinusoidal voltage (Va), a second inverter pole that generates a second three-phase sinusoidal voltage (Vb), and a third inverter pole that generates a third three-phase sinusoidal voltage (Vc). The three-phase AC motor 110 is coupled to the three-phase PWM inverter module 120 via the first inverter pole, the second inverter pole and the third inverter pole. The three-phase PWM inverter module 120 provides electric control for the electric motor 110, and generates alternating current (AC) waveforms (three-phase sinusoidal voltage signals) that drive the three-phase AC motor 110 at varying speeds based on the DC input voltage (Vdc). The three-phase AC motor 110 generates alternating current (AC) waveforms based on the three-phase sinusoidal voltage (Va), the second three-phase sinusoidal voltage (Vb) and the third three-phase sinusoidal voltage (Vc).

Phase currents (i.e., first resultant stator current (Ia), second resultant stator current (Ib), and third resultant stator current (Ic) flow through respective stator windings 115. The current into motor winding A 115 flows out motor windings B 115 and C 115, the current into motor winding B 115 flows out motor windings A 115 and C 115, and the current into motor winding C 115 flows out motor windings A 115 and B 115.

Phase to neutral voltages are generated across each of the stator windings 115 and back EMF voltages are induced in the respective stator windings 115 by the rotation of rotor with flux. In the case of a permanent magnet motor, the flux is built up by permanent magnet.

The outputs of the current regulated torque controller 150 are control signals that are provided to the gates of each of the transistors 122 to 127 of the inverter 120 and serve as operational control signals for the transistors 122 to 127. The inverter 120 operates in response to signals provided from a current regulated torque controller 150 to gates thereof to provide voltage to each phase 115 of the motor 110, each of the transistor pairs 122/125, 123/126 and 124/127 forming a phase leg of the inverter 120. The controller 150 can receive motor command signals and motor operating signals from the motor 110, and generate control signals for controlling the switching of solid state switching devices 122, 125, 123, 126, 124, 127 within the inverter sub-modules. By providing appropriate control signals to the individual inverter sub-modules, the closed loop motor controller controls switching of solid state switching devices 122, 125, 123, 126, 124, 127 within the inverter sub-modules and thereby control the outputs of the inverter sub-modules that are provided to motor windings 115, respectively. The first resultant stator current (Ia), the second resultant stator current (Ib), and the third resultant stator current (Ic) that are generated by the inverter sub-modules of the three-phase PWM inverter module 120 are provided to motor windings 115.

A coolant 155, such as motor oil, surrounds and cools the motor 110 during operation thereof and a temperature signal generator 156 determines the temperature of the coolant 155 from a thermocouple within the coolant 155 and provides a digital signal representation of the temperature of the coolant 155 on the line 260.

The motor 110 is also shown equipped with a rotor position sensor 160/165, which provides an output rotor position signal $\theta_m$ representing the mechanical rotational angular position of rotor relative to the stator windings 115. As used herein, the term "position sensor" is to be interpreted broadly and refers to any conventional position sensor apparatus that generates angular position information including a physical position sensor device or to a virtual software implementation of a physical position sensor, but to any kind of absolute position sensor or rotational transducer. In the particular implementation illustrated in FIG. 1, the position sensor 160/165 is a type of rotary electrical transformer used for measuring degrees of rotation, and is designed to generate position sensor outputs (PSout) 190 including one or more of output angular position information ($\theta_r$) and/or angular velocity ($\omega_r$) information that ideally corresponds to the angular position and/or angular velocity of the rotor with respect to a stator of the motor as the rotor rotates about the stator at an angular velocity. In other words, when operating correctly, the position sensor 160/165 generates absolute angular position information and/or angular velocity information that will ideally correspond to the mechanical angle ($\theta_r$) of the rotor and/or angular velocity of the rotor. Although not illustrated, one common type of position sensor 160 device is a resolver.

In FIG. 1, the position sensor 160/165 is implemented using a resolver 160 and a resolver-to-digital converter 165, but can generally be any type of position sensor known in the art including a Hall Effect sensor or any other similar sensing device or encoder known in the art that senses the angular position or angular velocity of the machine's rotor (not illustrated). The resolver 160 is coupled to the motor 110 for measuring rotor position and detecting the motor speed (i.e., angular velocity of the rotor) thereof. A resolver-to-digital converter 165 converts the signals from the resolver 160 to digital signals and provides those digital representations of angular position and detected speed of the rotor of the AC synchronous electric motor 110 to the current regulated torque controller 150.

In accordance with the embodiment, a temperature estimation controller 170 includes a temperature dependent torque command derater block 172, a high speed temperature estimation module 174, a low speed temperature estimation module 176, and a transition module 180.

The high speed temperature estimation module 174 receives synchronous frame currents $I_d$, $I_q$ from the current regulated torque controller 150 and estimates the phase temperatures ($T_a$, $T_b$, $T_c$) 175 of the stator windings 115. The estimated temperatures 175 are generated based on the synchronous frame currents $I_d$, $I_q$, motor speed 190, and the temperature of the coolant 155 provided on line 260. The low speed temperature estimation module 176 receives the detected current values $I_a$, $I_b$, $I_c$ and estimates the phase temperatures ($T_a$, $T_b$, $T_c$) 177 of the windings 115 of the phases in response to the current values $I_a$, $I_b$, $I_c$ and the temperature of the coolant 155 as provided on line 260.

The estimated phase temperatures ($T_a$, $T_b$, $T_c$) 175, 177 from the high speed temperature estimation module 174 and the low speed temperature estimation module 176 are provided to the transition module 180. The transition module 180 provides estimated phase temperatures ($T_a$, $T_b$, $T_c$) 175 and the estimated phase temperatures ($T_a$, $T_b$, $T_c$) 177 to an input of the temperature dependent torque command derater block 172. Transition module 180 selects one set of the estimated phase temperatures to provide to temperature dependent torque command derater block 172 based on the current operating speed 190 (angular velocity) of the motor 110 that is provided from resolver-to-digital converter 165.

A torque control signal (torque command T*) 171 is provided to the temperature dependent torque command derater block 172. The temperature dependent torque command derater block 172 modifies the torque command 171 in response to the selected set of phase temperatures ($T_a$, $T_b$, $T_c$) 175, 177 to generate a temperature derated torque control signal 173. The current regulated torque controller 150 receives current signals ($I_a$, $I_b$, $I_c$) from each stator winding 115 of the motor 110 and, in accordance with the present embodiment, modifies the currents at the stator windings 115 of the motor 110 in response to the temperature derated torque control signal 173 received from the temperature dependent torque command derater block 172 to generate the operational control signals provided to each phase leg 122/125, 123/126, 124/127 of the inverter 120.

Accordingly, the operational control signals apply the gain represented by the temperature derated torque control signal 173 to the command signals/voltage applied to the gates of the transistors 122-127. Thus, in accordance with the present embodiment, the currents at each of the stator windings 115 is received and modified by the current regulated torque controller 150 in response to the temperature derated torque control signal 173 to provide appropriate gain to the operational control signals while integrating a temperature dependent torque derating into the control structure at all speeds. Estimating the temperature of each stator winding 115 and comparing it with a predefined temperature threshold value can prevent overheating of the stator windings.

Figure 2:
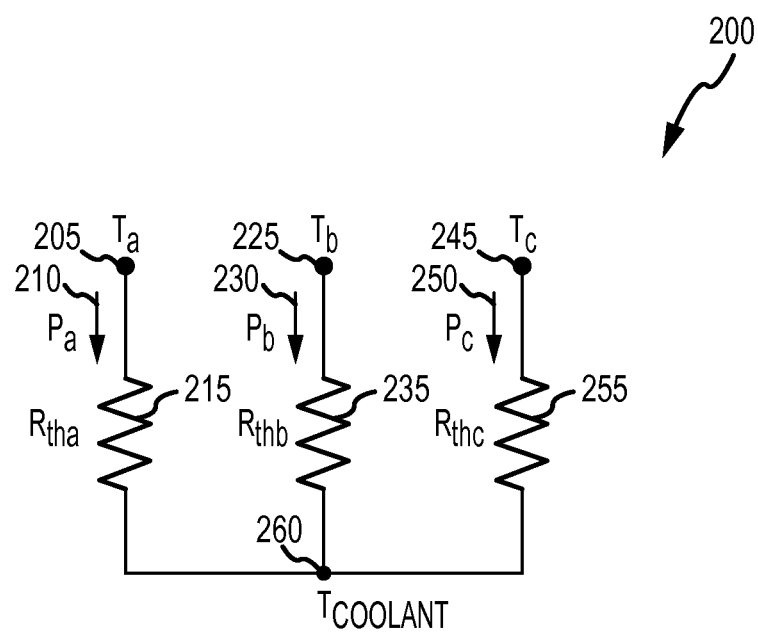
FIG. 2 illustrates a circuit diagram representation of a thermal impedance model in accordance with the embodiment of the present invention.

FIG. 2 illustrates a circuit diagram representation of a thermal impedance model 200 in accordance with an embodiment of the present invention. The thermal impedance model 200 can be utilized for high speed temperature estimation module 174 in accordance with the embodiment of the present invention to determine the estimated winding temperatures $T_a$ 205, $T_b$ 225, and $T_c$ 245 at each of the windings 115 of the motor 110 when the motor is operating a high speeds (i.e., rotor angular velocities greater than 75 rpms).

The thermal model depicted in FIG. 2 is based on the thermal equation (1) which is given by:

$$\text{Temperature Change} = \text{Thermal Impedance} \times \text{Total Power Dissipation} \quad (1)$$

For example, the temperature difference ($\Delta T_a$) between the temperature stator winding A ($T_a$) and temperature of the motor coolant ($T_{coolant}$) is equal to the product the thermal impedance ($R_{tha}$) 215 and power dissipation ($P_a$) 210 for that phase. The thermal impedance model 200 is described more fully below with reference to equations (4) through (6).

When the angular velocity of the motor's 115 rotor is above a particular value (e.g. 75 rpm), the estimated temperatures 205, 225, 245 for each of the stator windings 115 can be calculated based on a thermal impedance ($R_{th}$) 215, 235, 255 between that winding 115 and a temperature of the motor coolant 260 (where the thermal impedance 215 ($R_{tha}$) is the thermal impedance between the temperature $T_a$ of a first winding and the temperature of the motor coolant 260, a thermal impedance 235 ($R_{thb}$) is the thermal impedance between the temperature $T_b$ of a second winding and the temperature of the motor coolant 260, and a thermal impedance 255 ($R_{thc}$) is the thermal impedance between the temperature $T_c$ of a third winding and the temperature of the motor coolant 260). The temperature of the motor coolant has a temperature $T_{coolant}$ 260 as measured by a temperature sensor.

Power dissipation in the motor due to stator winding (or copper) loss and stator core (or iron) loss can be expressed using Equations (2) and (3) respectively.

$$P_{cu} = R_{DC} i_x^2, \quad R_{DC} = \frac{N_c N l_{turn}}{A_{turn} \sigma_{cu}} \quad (2)$$

where: $R_{DC}$ is the DC resistance per phase; $i_x$ is the stator current in a particular phase x, $N_c$ is the number of coils in a series; N is the number of turns per coil; $l_{turn}$ is the length of one turn; and $A_{turn}$, is the Area of one turn; and $\sigma_{cu}$ is the conductivity of copper.

$$P_{iron} = P_h + P_e = \varepsilon_h \left(\frac{f}{f_n}\right) B_m^\alpha + \varepsilon_e \left(\frac{f}{f_n}\right)^2 B^2 \quad (3)$$

where $P_{iron}$ is the core/iron power loss; $P_h$ is the power dissipation due to hysteresis losses; $P_e$ is the power dissipation due to eddy current losses; B and $B_m$ are the peak flux density, $\alpha$, $\epsilon_h$, and $\epsilon_e$ are constants for the particular core material, f is the operating frequency of the motor; and $f_n$ is the fundamental nominal frequency of the motor.

Techniques for estimating stator temperature at low speeds (below 75 rpm) were described in United States Patent Application Publication Number 2009/0189561 A1, filed Jan. 24, 2008 and assigned to the assignee of the present invention, which is incorporated by reference herein in its entirety.

At low motor operating speeds (e.g., below 75 rpms), core losses ($P_{iron}$) are negligible since those losses are speed (angular velocity) dependent. The angular velocity ($\omega$) is equal to $2\pi f$. As operating frequency (f) of the motor approaches zero, the core losses ($P_{iron}$) expressed in equation (2) also non, approach zero. However, at higher angular velocities (e.g., above 75 rpm), the operating frequency (f) increases and core/iron losses ($P_{iron}$) become non, significant. Accordingly, these core/iron losses ($P_{iron}$) need to be accounted for non, at high operating speeds (angular velocities) otherwise the estimated temperatures 205, 225, 245 will be inaccurate.

In accordance with the present embodiments, heat generated in the motor takes into account heat generated due to winding (or copper) losses and iron losses in the core when using the high speed temperature estimation module 174. The heat generated in the stator windings due to copper losses can be calculated using the stator currents and stator resistances as described above with reference to equation (2).

The thermal impedance in each phase takes into account (1) thermal impedance between the stator winding and the stator core, and (2) the thermal impedance between the stator core and the motor coolant. For example, for phase-a, the thermal impedance can be represented mathematically as $R_{tha}=R_{wca}+R_{cca}$; where $R_{tha}$ is the thermal impedance between the stator winding in phase-a and the motor coolant, $R_{wca}$ is the thermal impedance between the stator winding a and stator core, and $R_{cca}$ is the thermal impedance between the stator core and motor coolant.

At high speeds, the estimated temperature of the windings 115 can be estimated using (a) the thermal impedance $R_{tha}$ 215, (b) the thermal impedance $R_{thb}$ 235, and (c) the thermal impedance $R_{thc}$ 255 and Equations (4), (5) and (6) as follows:

$$T_a = R_{tha}\left(\frac{1+T_{za}s}{1+2\xi_a T_{wa}s+(T_{wa}s)^2}\right)(I_s^2 R_{sa} + P_{core}) + T_{coolant} \quad (4)$$

$$T_b = R_{thb}\left(\frac{1+T_{zb}s}{1+2\xi_b T_{wb}s+(T_{wb}s)^2}\right)(I_s^2 R_{sb} + P_{core}) + T_{coolant}, \quad (5)$$

$$T_c = R_{thc}\left(\frac{1+T_{zc}s}{1+2\xi_c T_{wc}s+(T_{wc}s)^2}\right)(I_s^2 R_{sc} + P_{core}) + T_{coolant} \quad (6)$$

where $T_{zx}$ is the lead time constant [seconds], $T_{wx}$ is the natural damped frequency [seconds], $\xi_x$ is the damping factor, $I_s$ is the RMS stator current value [Amps] computed based on the synchronous reference frame current signals ($I_{qs}^e$, $I_{ds}^e$), $R_{sx}$ is the stator resistance [$\Omega$], $P_{core}$ is the stator core/iron loss [Watts], $T_{coolant}$ is the motor coolant temperature [° C.]; and x represents a, b, or c. It is noted that at zero speed, the stator currents $I_a$, $I_b$, or $I_c$ may not be the same because there will be instant where only two phases are carrying current and the third phase has zero current flowing. Hence, equation (2) uses the actual stator currents to compute stator winding (or copper) losses. However, for high speed estimation, the stator currents $I_a$, $I_b$, or $I_c$ in all three phases should be the same. As such, stator winding power loss in each phase can be computed using the RMS value of the motor currents, $I_s$.

The thermal impedance model 200 per phase is represented in equations (4), (5), and (6) by the combination of $R_{thx}$ (where x=a, b, c) and a $2^{nd}$ order transfer function model that is used to estimate the stator temperatures 205, 225, 245 as a function of power dissipation (copper+core losses) between each individual phase and the motor coolant temperature. The bracketed terms in Equations (4), (5) and (6) represent the thermal impedance model for total power loss/dissipation ($P_x$) between the stator winding x and the motor coolant due to the thermal impedance of each phase 215, 235, 255. For example, the power loss/dissipation (Pa) takes into account the winding (or copper) power loss ($I_s^2 R_{sa}$) for stator winding A and the core (or iron) power loss $P_{core}$. The thermal impedances as well as the coefficients of the $2^{nd}$ order transfer function can be developed empirically off-line from measured test data. This requires the measurement of the phase currents, the temperature readings of each of the phase windings from either a thermistor or thermocouple, as well as the measurement of the motor coolant temperature 260. This thermal model characterization process can be performed offline using an instrumented motor (i.e. a motor equipped with temperature sensors). After the characterization process is completed, the developed thermal model can now be fully utilized for online temperature estimation with the same class of motor that does not have any temperature sensors.

Figure 3:
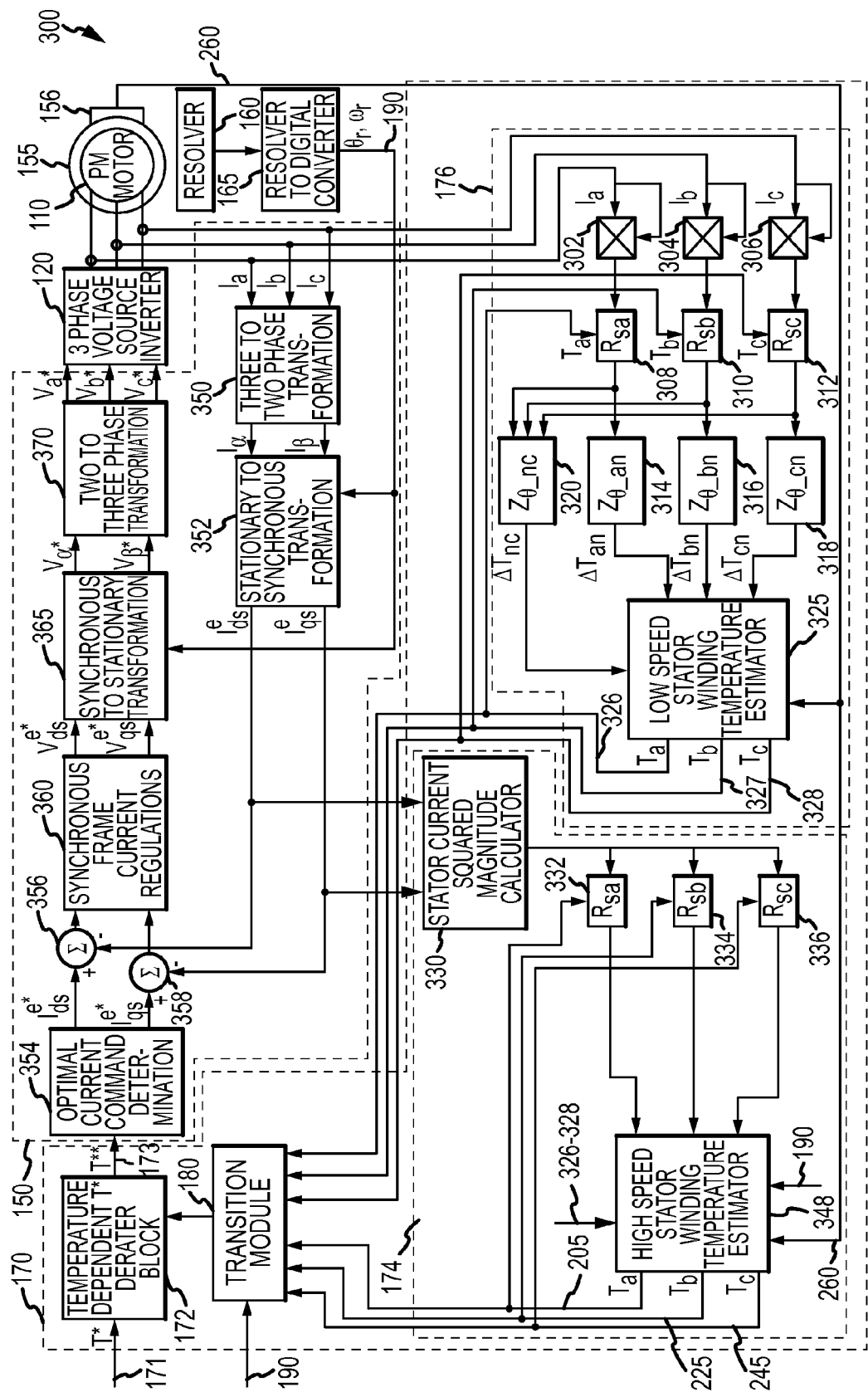
FIG. 3 illustrates a more detailed diagram of the electric motor system of FIG. 1 in accordance with embodiments of the present invention.

FIG. 3 illustrates a more detailed diagram of the electric motor system 100 of FIG. 1 in accordance with embodiments of the present invention.

As illustrated in FIG. 3, the system 300 includes a three-phase AC motor 110, a three-phase PWM inverter module 120 coupled to the three-phase AC motor 110, a synchronous frame current regulator module 360 (that may include summing junctions and current controller module which are not illustrated) that receives the current commands from a torque-to-current mapping module 354, summing junctions 356, 358 that are coupled to the synchronous frame current regulator module 360, a synchronous-to-stationary conversion module 365/370, a stationary-to-synchronous conversion module 350/352 that provides actual currents to summing junctions 356, 358, and the stator winding temperature estimation controller 170. Although not illustrated, the system can include other well-known modules and control loops depending on the particular implementation. Operation of the system 300 will now be described. In the particular implementation illustrated in FIG. 3, the three-phase AC motor 110 can be referred to as a star-connected (or Y-connected) three-phase electric motor 110, and the three-phase PWM inverter module 120 can be referred to as a full-wave bridge inverter 120. For sake of brevity, the description of various blocks that were described with reference to FIG. 1 will not be described again.

The stator currents $I_a$, $I_b$ and $I_c$ are supplied to combiners 302, 304, 306, respectively, of the low speed temperature estimation module 176. The combiners 302, 304, 306, use the currents $I_a$, $I_b$ and $I_c$ to generate waveforms equivalent to the AC RMS currents for each of the stator windings 115 and provides the AC RMS currents to blocks 308, 310 and 312, respectively.

Block 308 calculates the stator phase resistance $R_{sa}$ of the stator winding of phase a in response to the estimated temperature $T_a$ 326 of the stator wiring of phase a and multiplies it with the AC RMS value of the stator current $I_a^2$ from the output of the combiner 302. Block 308 then provides the product thereof to block 314 for calculation of the temperature rise due to the thermal impedance $Z_{\theta\_an}$. Likewise, blocks 310 and 312 calculate the stator phase resistances $R_{sb}$ and $R_{sc}$, respectively, from the temperatures $T_b$ and $T_c$ of the stator wirings of phases b and c, respectively, and multiply them with the respective outputs of combiners 304, 306. The outputs of blocks 310 and 312 are provided to blocks 316 and 318, respectively, for the calculation of the temperature rise due to the thermal impedances $Z_{\theta\_bn}$, $Z_{\theta\_cn}$ of stator windings B and C.

Outputs of blocks 308, 310 and 312 are also provided to inputs of block 320 for calculation of the temperature rise due to the thermal impedance $Z_{\theta\_nc}$ between the thermal neutral and the coolant 155. The outputs of blocks 314, 316, 318 and 320 as well as the digital signal representing the temperature $T_{Coolant}$ of the coolant 155 on line 260 are provided to inputs of a low speed stator phase temperature estimator 325 for estimation of the temperatures $T_a$, $T_b$ and $T_c$ of the windings 115 of the motor 110 as described in U.S. Patent Application Publication 2009/0189561 A1.

As will be explained below, the high speed temperature estimation module 174, uses synchronous reference frame current signals $I_d$ and $I_q$ (i.e., the d and q axes currents), the motor speed 190 and the motor coolant temperature 260 to compute estimated winding temperatures 205, 225, 245.

Stator phase resistances $R_{sa}$, $R_{sb}$ and $R_{sc}$, are calculated based on estimated stator winding temperature outputs 205, 225, 245 fed back from the high speed stator winding temperature estimator 348. The synchronous reference frame current signals $I_d$ and $I_q$ are provided from the current regulated torque controller 150 to a stator current square magnitude calculator 330. The stator current square magnitude calculator 330 provides this output to blocks 332, 334 and 336. Block 330 uses the synchronous reference frame current signals $I_d$, $I_q$ to compute a squared RMS value ($I_s^2$) of these inputs. The output ($I_s^2$) of block 330 represents the squared RMS value of the stator current ($I_s^2$).

Blocks 332, 334 and 336 calculate the stator winding 115 resistances $R_{sa}$, $R_{sb}$, and $R_{sc}$, based on the respective stator winding 115 temperatures, and multiply the squared RMS value of the stator currents ($I_s^2$) by the stator winding 115 resistances. The outputs of blocks 332, 334 and 336 represent stator winding (or copper) power losses and are provided to the high speed stator winding temperature estimator 348.

The outputs of blocks 332, 334, and 336, the digital signal representing the temperature $T_{Coolant}$ of the coolant 155 on line 260, and the motor speed signal 190 from the resolver to digital converter 165 are provided as inputs to the high speed stator phase temperature estimator 348. Then the high speed stator winding temperature estimator 348 uses these inputs to estimate stator winding temperatures. Processing performed by the high speed stator winding temperature estimator 348 will be described with reference to FIGS. 4-6. $T_a$, $T_b$, and $T_c$ of the three windings 115 of the motor 110 in accordance with Equations (4), (5) and (6).

The outputs $T_a$, $T_b$, and $T_c$ 205, 225, 245 representing estimations of the stator winding temperatures of the windings 115 as calculated by the high speed stator winding temperature estimator 348 are provided to the transition module 180, along with the estimated temperatures for the low speed stator winding temperature estimator 325. The transition module 180 also receives a motor speed input 190 from converter 165. Based on motor speed, transition module 180 selects the output of either the high speed stator winding temperature estimator 348 or the low speed estimator 325, and provides the selected set of outputs ($T_a$, $T_b$, $T_c$) to the temperature dependent torque command derater block 172. For example, at low speeds (below 75 rpm) the transition module 180 selects outputs generated by 325, whereas high speeds (greater than 75 rpm), the transition module 180 selects outputs generated by the high speed stator winding temperature estimator 348. The derater 172 then adjusts the torque command T* 171 based on the estimated stator winding temperatures provided from transition module 180.

The torque command T* 171 is provided to the temperature dependent torque command derater block 172 for generation of the derated torque command signal T 173 in response to the phase temperatures ($T_a$, $T_b$, $T_c$) provided from the transition module 180. The derated torque command T 173 helps prevent damage to the stator windings 115 due to overheating. In accordance with the present embodiment, the temperature dependent torque command derater block 172 derates (i.e., lowers) the torque command T* 171 to derive the derated torque command T** 173 in response to the detection of the stator temperature of one or more of the stator windings 115 being higher than a predetermined temperature.

The current regulated torque control module 150 includes a stationary-to-synchronous conversion module 350/352 that comprises a three-to-two phase transformation block 350 and a stationary-to-synchronous transformation block 352.

The three-to-two phase transformation block 350 receives the three resultant stator currents (Ia, Ib, Ic) that are measured phase currents from motor stator windings 115, and transforms these currents into two phase stator currents, $I_\alpha$ and $I_\beta$, in the stationary reference frame. The stationary-to-synchronous transformation block 352 receives the stator currents ($I_\alpha$, $I_\beta$) and the rotor angular position (θr) 190 and transforms the currents $I_\alpha$ and $I_\beta$ to current values $I_{ds}^e$ and $I_{qs}^e$ (feedback d-axis current signal ($I_{ds}^e$) and a feedback q-axis current signal ($I_{qs}^e$) in the synchronous reference frame, where the DC current values provide for easier calculation of the operational control signals in accordance with the present embodiment. The output of the stationary-to-synchronous transformation module 352 can also be called synchronous reference frame current signals ($I_{qs}^e$, $I_{ds}^e$). The synchronous reference frame current signals ($I_{qs}^e$, $I_{ds}^e$) are supplied to the summing junctions 356 and 358 to generate the current errors (Idserror_e and Iqserror_e). As will be described below, the summing junction 356 subtracts the feedback d-axis current signal ($I_{qs}^e$) from the d-axis current command signal ($I_{ds}^{e*}$) to generate a d-axis current error signal (Idserror_e), and the summing junction 358 subtracts the feedback q-axis current signal ($I_{qs}^e$) from the q-axis current command signal ($I_{ds}^{e*}$) to generate a q-axis current error signal (Iqserror_e).

In one implementation, the stationary-to-synchronous conversion module 350/352 receives the stator currents (Ia, Ib, Ic) from the three-phase AC motor 110. The stationary-to-synchronous conversion module 350/352 can use these stator currents along with a synchronous frame angle $\theta_e$ to generate a feedback d-axis current signal (Ids_e) and a feedback q-axis current signal (Iqs_e). The angle for synchronous frame ($\theta_e$) can be calculated differently depending on the specific type of AC motor. For example, in a permanent magnet motor the synchronous frame angle ($\theta_e$) can be calculated based on the rotor position $\theta_m$, and motor pole-pair. In an induction motor, the synchronous frame angle ($\theta_e$) can be calculated based on the rotor position $\theta_m$, the motor pole pair and slip frequency. The process of stationary-to-synchronous conversion is well-known in the art as dq transformation or Park's transformation and is illustrated in Equation (7) as follows;

$$\begin{bmatrix} i_{ds}^e \\ i_{qs}^e \end{bmatrix} = T(\theta_e) \begin{bmatrix} i_a \\ i_b \\ i_c \end{bmatrix} = \frac{2}{3} \begin{bmatrix} \cos(\theta_e) & \cos\left(\theta_e - \frac{2}{3}\pi\right) & \cos\left(\theta_e + \frac{2}{3}\pi\right) \\ \sin(\theta_e) & \sin\left(\theta_e - \frac{2}{3}\pi\right) & \sin\left(\theta_e + \frac{2}{3}\pi\right) \end{bmatrix} \begin{bmatrix} i_a \\ i_b \\ i_c \end{bmatrix} \quad (7)$$

An optimal current command determination block 354 of the current regulated torque control module 150 generates, from the derated torque command signal T** 173, two current commands in the synchronous reference frame, $I_{ds}^{e*}$ and $I_{qs}^{e*}$. The optimal current command determination block 354 is a torque-to-current mapping module receives the derated torque command signal (T) 173 from the derater 172, a speed (ω1) of the motor, and a DC input voltage (Vdc) as inputs and maps the derated torque command signal (T) 173 to a d-axis current command signal (Ids) and a q-axis current command signal ($I_{qs}^{e*}$).

As described above, the synchronous reference frame digital current values $I_d$ and $I_q$ are provided to the stator current square magnitude calculator 330. In addition, the synchronous reference frame digital current values $I_d$ and $I_q$ are provided to d and q phase summers 356 and 358, respectively.

The current commands $I_{ds}^{e}$ and $I_{qs}^{e*}$ are combined with the current values $I_d$ and $I_q$ at the d and q phase summers 356 and 358, respectively, to generate current error signals. More specifically, the summing junction 356 receives the d-axis current command signal ($I_{ds}^{e*}$) and the feedback d-axis current signal ($I_{ds}^{e}$) and generates a first output signal, and the summing junction 358 receives the q-axis current command signal ($I_{qs}^{e*}$) and the feedback q-axis current signal ($I_{qs}^{e}$) generates a second output signal.

Synchronous frame current regulators 360 generate the synchronous frame operational signals having voltages $V_{ds}^{e*}$ and $V_{qs}^{e*}$. The synchronous frame current regulator 360 uses the first and second output signals to generate a d-axis voltage command signal ($V_{ds}^{e*}$) and a q-axis voltage command signal ($V_{qs}^{e*}$). The process of current to voltage conversion is well-known in the art and for sake of brevity will not be described in detail.

The synchronous-to-stationary conversion module 365/370 receives the d-axis voltage command signal ($V_{ds}^{e*}$) and the q-axis voltage command signal ($V_{qs}^{e*}$), and based on these signals, generates a three-phase sinusoidal voltage command ($V_a^*$), a second three-phase sinusoidal voltage command ($V_b^*$), and a third three-phase sinusoidal voltage command ($V_c^*$) using Equation (8) below.

$$\begin{bmatrix} v_a^* \\ v_b^* \\ v_c^* \end{bmatrix} = T(\theta_e)^{-1} \begin{bmatrix} v_{ds}^{e*} \\ v_{qs}^{e*} \end{bmatrix} = \begin{bmatrix} \cos(\theta_e) & -\sin(\theta_e) \\ \cos\left(\theta_e - \frac{2}{3}\pi\right) & -\sin\left(\theta_e - \frac{2}{3}\pi\right) \\ \cos\left(\theta_e + \frac{2}{3}\pi\right) & -\sin\left(\theta_e + \frac{2}{3}\pi\right) \end{bmatrix} \begin{bmatrix} v_{ds}^{e*} \\ v_{qs}^{e*} \end{bmatrix} \quad (8)$$

The process of synchronous-to-stationary conversion is done using inverse Clarke and Park Transformations that are well-known in the art and for sake of brevity will not be described in detail. One implementation of the inverse Clarke and Park Transformations is described in the above referenced document "Clarke & Park Transforms on the TMS320C2xx."

In one implementation, the synchronous-to-stationary transformation block 365 transforms the synchronous frame operational signals $V_{ds}^{e*}$ and $V_{qs}^{e*}$ to two stationary frame operational signals $V_\alpha^*$ and $V_\alpha^*$. In particular, the synchronous-to-stationary transformation block 365 receives the d-axis voltage command signal ($V_{ds}^{e*}$), the q-axis voltage command signal ($V_{qs}^{e*}$) 174 and the rotor position angle (θr), and based on these signals, generates stationary frame operational signals $V_\alpha^*$ and $V_\beta^*$.

A two-to-three phase transformation block 370 receives the α-axis voltage command signal ($V_\alpha^*$), and the β-axis voltage command signal ($V_\beta^*$), and transforms the two stationary frame operational signals $V_\alpha^*$ and $V_\beta^*$ to three-phase sinusoidal voltage command signals $V_a^*$, $V_b^*$ and $V_c^*$ that are provided to the respective three phase legs 122/125, 123/126 and 124/127 of the inverter 120.

In this manner, the operational control signals for the inverter 120 are generated in response to the derated torque signal T** 173 such that overheating of the windings 115 can be avoided at both high motor operating speeds (i.e., rotor angular velocities greater than 75 rpms) and low motor operating speeds (i.e., rotor angular velocities less than 75 rpms).

The three-phase PWM inverter module 120 receives the first three-phase sinusoidal voltage command (Va*), the second three-phase sinusoidal voltage command (Vb*), and the third three-phase sinusoidal voltage command (Vc*) from the synchronous-to-stationary conversion module 365/370, and generates input voltage signals for the motor 110. As will be appreciated by those skilled in the art, modulation can be used for the control of pulse width modulation (PWM). The particular PWM algorithm implemented in the three-phase PWM inverter module (not shown) can be any known PWM algorithm including PWM algorithms.

Figure 4:
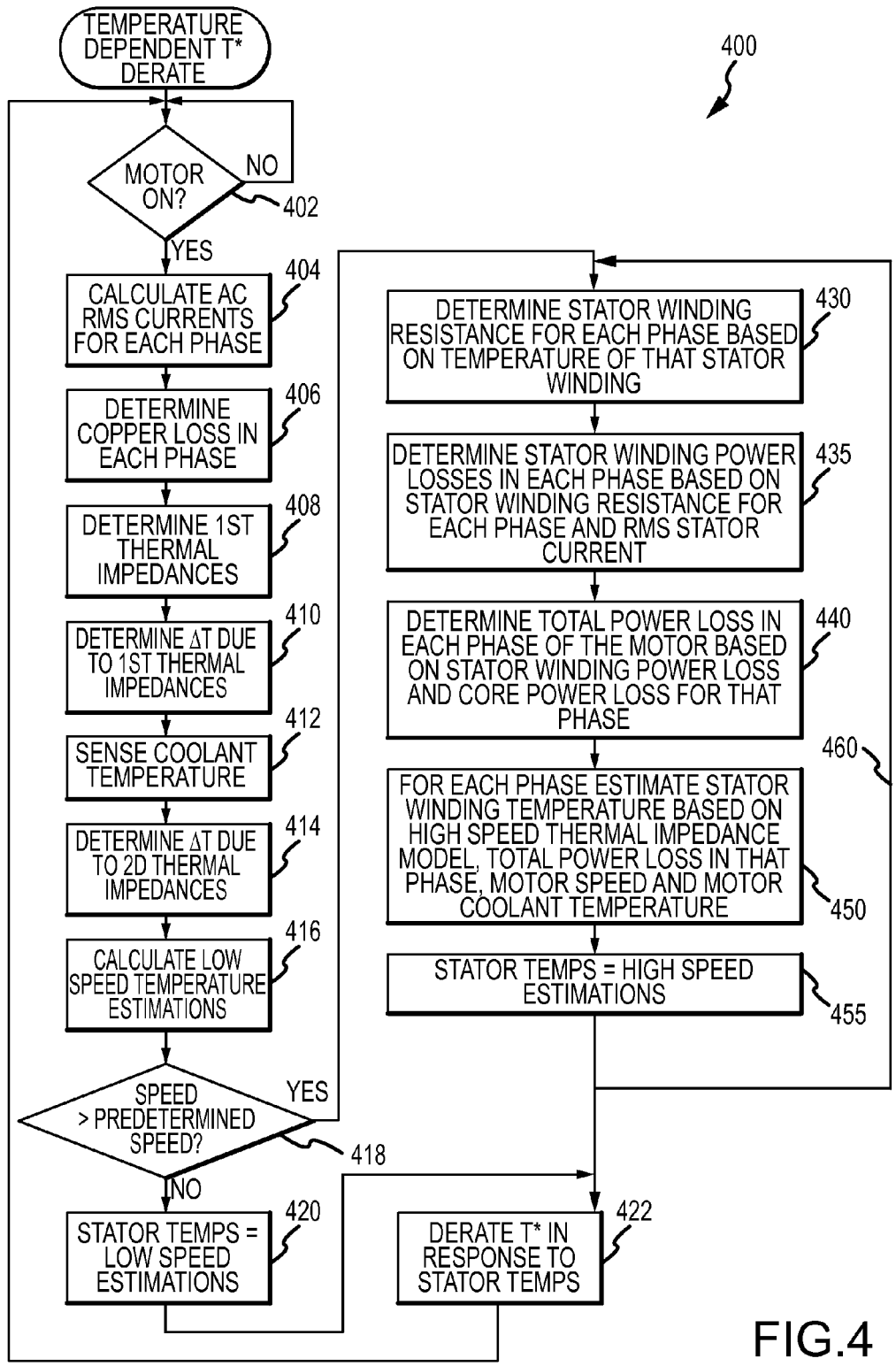
FIG. 4 illustrates a flowchart of the operation of a temperature estimation controller of the electric motor system of FIG. 3 in accordance with the embodiment of the present invention.
Figure 5:
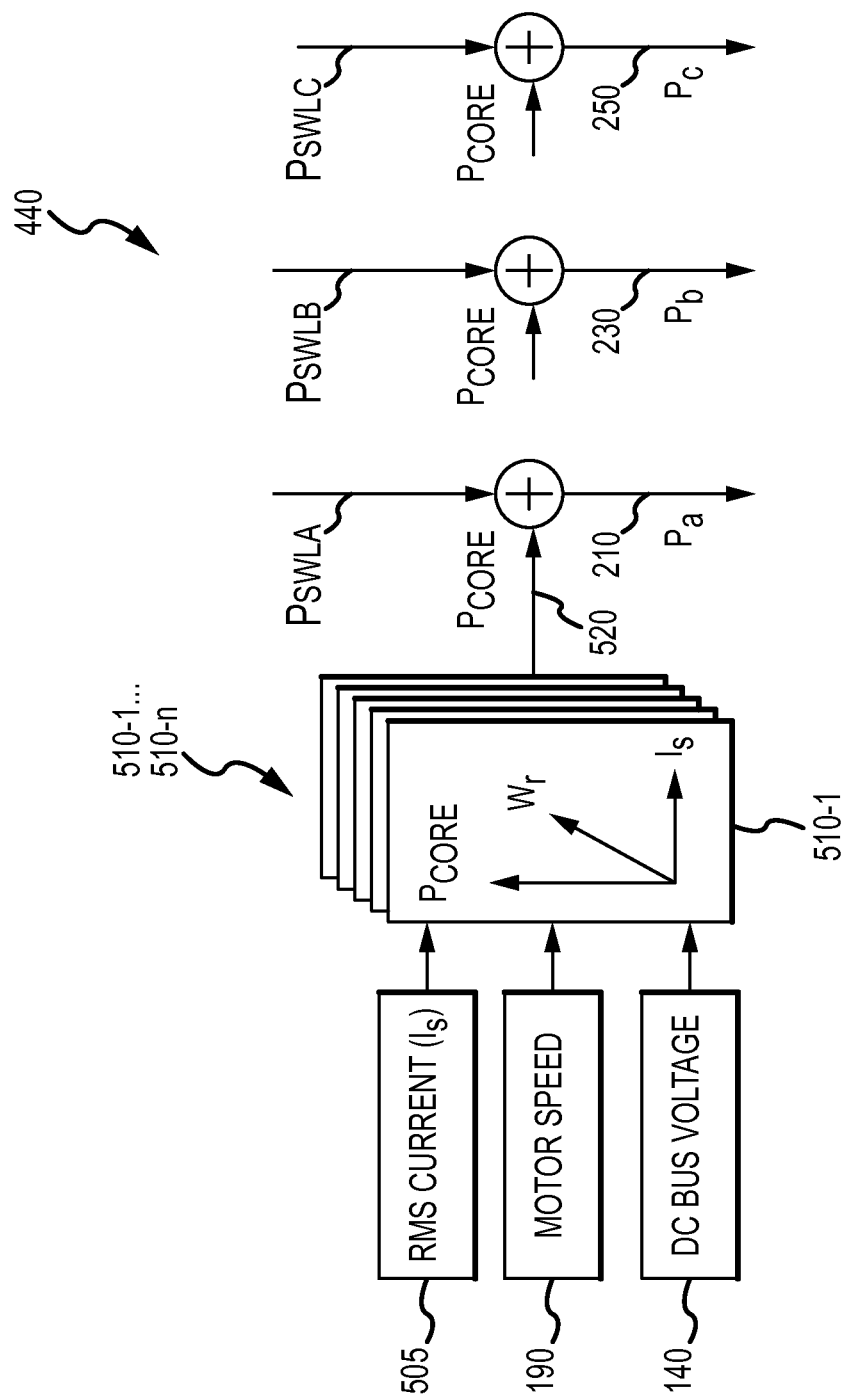
FIG. 5 illustrates a method for determining total power loss in each phase of the motor based on stator winding power loss and core power loss in each phase in accordance with the embodiment of the present invention.
Figure 6:
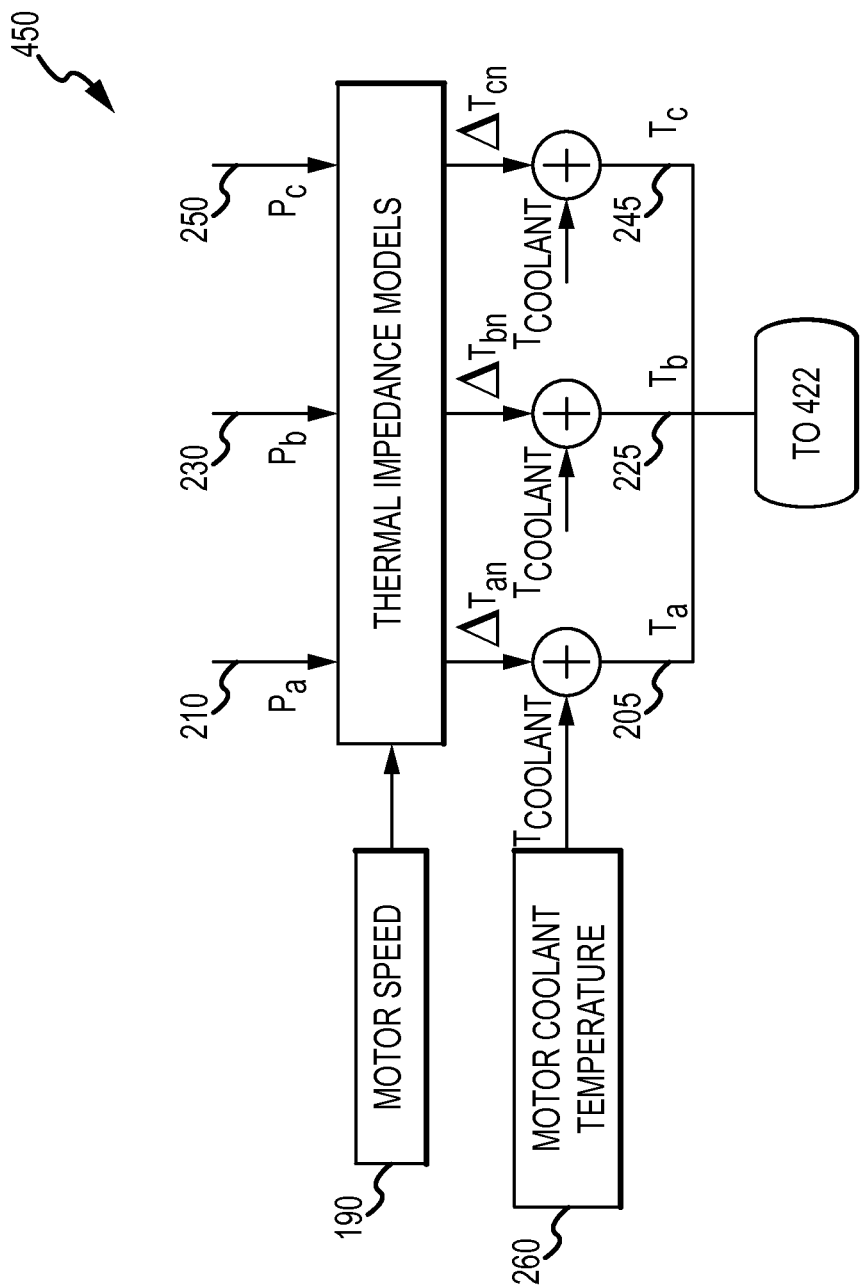
FIG. 6 illustrates a method for estimating stator winding temperatures based on total power loss in each phase of the motor, motor speed (i.e., rotor angular velocity) and motor coolant temperature in accordance with the embodiment of the present invention.

While FIG. 1 depicts the temperature estimation controller 170 including identifiable modules and blocks such as the high and low speed temperature estimation modules 174, 176, the transition module 180 and the temperature dependent torque command derater block 172, it will be appreciated that these blocks or modules can be implemented as software modules that execute on a microprocessor, and therefore operation of the various blocks/modules of temperature estimation controller 170 can alternately be represented as steps of a method as will now be described with reference to FIGS. 4-6.

FIG. 4 illustrates a flowchart of a method 400 the operation of a temperature estimation controller 170 of the electric motor system of FIG. 3 in accordance with the embodiment of the present invention.

Processing begins when the motor 110 is turned on at step 402. After processing determines that the motor 110 is turned on at step 402, an alternating current (AC) root mean square (RMS) current value is calculated 404. The copper loss of each of the stator windings 115 of the motor 110 is next calculated at step 406 in response to the AC RMS current values thereof, and first thermal impedances for each of the stator windings 115 of the motor 110 are calculated at step 408 in response to the copper loss calculated at step 406.

At step 410, temperature rises in the stator windings 115 due to corresponding thermal impedances (from step 408) are determined.

At step 412, the temperature of the coolant 155 is sensed.

At step 414, the temperature rise due to the thermal impedance of the thermal neutral with respect to the temperature of the coolant 155 is determined.

At step 416, low speed stator winding temperatures are then estimated for each phase based on results generated at steps, 410, 412, and 414.

At step 418, processing determines whether the speed of the motor 110 is greater than a predetermined speed (e.g., 75 rpms).

When the speed is less than (i.e., not greater than) the predetermined speed, at step 420 the stator winding temperatures $T_a$, $T_b$ and $T_c$ are set equal to the estimated low speed stator temperatures (from step 416). The torque command T* 171 is then derated at step 422 to prevent overheating of one or more of the stator windings 115. Processing then returns to step 402.

When the speed is determined to be greater than the predetermined speed at step 418, processing proceeds to step 430.

At step 430 through 450 the high speed stator winding temperatures are estimated for each of the stator windings 115.

At step 430, stator winding 115 resistance of each stator winding 115 is determined based on temperature of that stator winding 430 using equations (9)-(11) as follows:

$$R_{sa} = R_{25}(1+\alpha(T_a-25)) \quad (9)$$

$$R_{sb} = R_{25}(1+\alpha(T_b-25)) \quad (10)$$

$$R_{sc} = R_{25}(1+\alpha(T_c-25)) \quad (11)$$

where the $R_{sa}$, $R_{sb}$, and $R_{sc}$ are that stator winding resistances, $T_a$, $T_b$, $T_c$ are the estimated stator winding temperatures, $R_{25}$ designates the stator winding resistance at ambient temperature (25° C.), and α represents the temperature coefficient of resistance (typically 0.00391° C. for copper winding). On the first iteration (when the system switches from low speed stator winding temperature estimation to high speed stator winding temperature estimation), the high speed stator winding temperature estimator 348 uses the estimated stator winding temperature output from the low speed stator phase temperature estimator 325 to determine the stator winding resistances. On subsequent iterations, the high speed stator winding temperature estimator 348 uses the estimated stator winding temperature output from block 455 (provided via feedback loop 460) to determine the stator winding resistances.

At step 435 processing then determines a stator winding power losses in each phase based on stator winding resistance in each phase (from step 430) and the RMS stator current flowing in the stator windings.

At step 440, processing then determines total power loss in each phase of the motor based on stator winding power loss and core power loss for that phase 440. One implementation of step 440 will be described below with reference to FIG. 5.

At step 450, processing estimates stator winding temperature for each phase based on total power loss in that phase (from step 440), motor speed 190, and motor coolant temperature 260. One implementation of step 450 will be described below with reference to FIG. 6. At step 455, the stator winding temperatures $T_a$, $T_b$ and $T_c$ are set equal to the high speed estimated stator winding temperatures (from step 450).

In addition, the estimated stator winding temperatures computed at step 450 are also provided to the derater block 172 and used to derate torque command T* 171. The method 400 then loops back to step 402.

FIG. 5 illustrates a method 500 for determining total power loss in each phase of the motor based on stator winding power loss and core power loss in each phase in accordance with the embodiment of the present invention.

Although not illustrated in FIG. 5, as described above, the stator winding power losses, $P_{SWLA}$, $P_{SWLB}$, and $P_{SWLC}$, for each phase are calculated based the squared RMS stator current value ($I_s^2$) and stator resistance value ($R_{sa}$, $R_{sb}$, $R_{sc}$) for that stator winding. For example, $P_{SWLA} = I_s^2 * R_{sa}$, where $I_s$ is the RMS stator current for phase-A, and $R_{sa}$ is the calculated stator resistance 430 of phase-A based on the temperature of that stator winding.

The motor core loss ($P_{core}$) is a function of the motor speed 190, RMS stator winding current 505, and dc bus voltage 140. A plurality of lookup tables (LUTs) 510-1 ... 510-n are provided. The LUTs are developed at various DC bus voltages 140 that will produce the core loss power dissipation ($P_{core}$) based on motor speed 190 and RMS current 505. Each of the LUTs 510-1 ... 510-n corresponds to a particular DC bus voltage, and specifies values of core power loss for different combinations of motor speed and root-mean-square (RMS) stator winding current.

Based on the DC bus voltage 140, the two closest corresponding LUTs 510-1 ... 510-n are selected (i.e., the particular LUTs that correspond to the particular DC bus voltage 140), the motor speed 190 and RMS current ($I_s$) 505 are input to each of the selected LUTs 510-1 ... 510-n, and each LUT generates core power loss ($P_{core}$) values. Interpolation (e.g., linear interpolation or other known interpolation techniques) can be used to generate a core loss value ($P_{core}$) 520 corresponding to that motor speed 190 and RMS core, current 505.

For example, the core power loss ($P_{core}$) 520 is determined by core, selecting two lookup tables 510 from the plurality of LUTs 510-1 ... 510-n based on a DC bus voltage input, inputting the motor speed and the stator winding current into a first one of the selected lookup tables to compute a first core power loss value, inputting the motor speed and the stator winding current into a second one of the selected lookup tables to compute a second core power loss value, and performing an interpolation based on the DC bus voltage, the first core power loss value, and the second core power loss value to compute the core power loss ($P_{core}$) 520.

The stator winding (or copper) power loss for each phase ($P_{SWLA}$, $P_{SWLB}$, $P_{SWLC}$) is then added to the core power loss for each phase ($P_{core}$) to obtain a total power loss for each phase ($P_a$, $P_b$, $P_c$) 210, 230, 250. As will be described below with reference to FIG. 6, the total power loss values ($P_a$, $P_b$, $P_c$) for each phase are then used by the thermal impedance models to compute the estimated stator winding temperature for each phase ($T_a$ 205, $T_b$ 225, and $T_c$ 245).

FIG. 6 illustrates a method 450 for estimating stator winding temperatures based on total power loss ($P_a$, $P_b$, $P_c$) 210, 230, 250 in each phase of the motor, motor speed 190 (i.e., rotor angular velocity) and motor coolant temperature 260 in accordance with the embodiment of the present invention.

The bracketed terms in Equations (4), (5), (6) are thermal impedance models for total power loss/dissipation between the stator windings and motor coolant in each phase. The total power loss in each phase ($P_a$, $P_b$, $P_c$) 210, 230, 250 and the motor speed 190 are input into the thermal impedance models to calculate a change in temperature for each phase ($\Delta T_{an}$, $\Delta T_{bn}$, and $\Delta T_{cn}$). The change in temperature for each phase is then added to the motor coolant temp 260 to obtain the estimated stator winding temperature for each phase ($T_a$ 205, $T_b$ 225, and $T_c$ 245). The winding temperature for each phase is then used to derate the torque command T* 171 at step 422.

The disclosed embodiments described above are described as being applied to a three-phase permanent magnet synchronous AC motor (PMSM), and this term should be understood to encompass Interior Permanent Magnet Synchronous Motor (IPMSM), and Surface Mount Permanent Magnet Synchronous Motor (SMPMSM). However, the disclosed embodiments can apply generally to synchronous AC machines, which can include permanent magnet machines. Permanent magnet machines include surface mount permanent magnet machines (SMPMMs) and interior permanent magnet machines (IPMMs). Although an AC machine can be an AC motor (i.e., apparatus used to convert AC electrical energy power at its input to produce to mechanical energy or power), an AC machine is not limited to being an AC motor, but can also encompass generators that are used to convert mechanical energy or power at its prime mover into electrical AC energy or power at its output. Any of the machines can be an AC motor or an AC generator.

Moreover, although the disclosed methods, systems and apparatus can be implemented in operating environments such as a hybrid/electric vehicle (HEV), it will be appreciated by those skilled in the art that the same or similar techniques and technologies can be applied in the context of other systems. In this regard, any of the concepts disclosed here can be applied generally to "vehicles," where the term "vehicle" broadly refers to a non-living transport mechanism having an AC motor. Examples of such vehicles include automobiles such as buses, cars, trucks, sport utility vehicles, vans, vehicles that do not travel on land such as mechanical water vehicles including watercraft, hovercraft, sailcraft, boats and ships, mechanical under water vehicles including submarines, mechanical air vehicles including aircraft and spacecraft, mechanical rail vehicles such as trains, trams and trolleys, etc. In addition, the term "vehicle" is not limited by any specific propulsion technology such as gasoline or diesel fuel. Rather, vehicles also include hybrid vehicles, battery electric vehicles, hydrogen vehicles, and vehicles which operate using various other alternative fuels.

It should be observed that the disclosed embodiments reside primarily in combinations of method steps and apparatus components. Those of skill would further appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components or modules and various processing steps. However, it should be appreciated that such block components or modules may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method comprising the steps of:
    determining whether a motor speed is greater than a speed threshold; and
    estimating, when motor speed is greater than the speed threshold, first estimated stator winding temperatures for each of a plurality of stator windings,
    wherein the first estimated stator winding temperature for each stator winding is estimated based on a combined thermal impedance between that stator winding and motor coolant, and a total power loss, wherein the total power loss comprises stator winding power loss and a core power loss.

2. The method according to claim 1 wherein the step of estimating, when motor speed is greater than the speed threshold, first estimated stator winding temperatures for each of a plurality of stator windings comprises the step of:
    determining a stator winding resistance for each stator winding based on a temperature of that stator winding;

determining a stator winding power loss in each phase based on said stator winding resistance for that phase and a root mean square (RMS) stator current;

determining total power loss in each phase of the motor based on said stator winding power loss for that phase and a core power loss;

generating a phase temperature change ($\Delta T_{an}$) for each phase based on the total power loss in that phase, motor speed and the combined thermal impedance for that phase; and estimating a stator winding temperature for each of the stator windings based on a phase temperature change ($\Delta T_{an}$) and motor coolant temperature.

3. The method according to claim 2, wherein said combined thermal impedance comprises a first thermal impedance between the stator winding and the stator core, and a second thermal impedance between the stator core and the motor coolant.

4. The method according to claim 3, wherein said core power loss is a function of motor speed, stator winding current, and dc bus voltage, and wherein core power loss is determined by:

providing a plurality of lookup tables, wherein each lookup table corresponds to a particular DC bus voltage, and specifies values of core power loss for different combinations of motor speed and root-mean-square (RMS) stator winding current;

selecting two lookup tables from the plurality of lookup tables based on a DC bus voltage input;

inputting the motor speed and the stator winding current into a first one of the selected lookup tables to compute a first core power loss value;

inputting the motor speed and the stator winding current into a second one of the selected lookup tables to compute a second core power loss value; and performing an interpolation based on the DC bus voltage, the first core power loss value, and the second core power loss value to compute the core power loss.

5. The method in accordance with claim 4 wherein the step of determining a stator winding power loss in each phase based on said stator winding resistance for each phase and a root mean square (RMS) stator current comprises the steps of:

determining an alternating current (AC) root mean square (RMS) stator current representative of stator currents in each of the stator windings; and determining the stator winding power loss of each of the stator windings based on the AC RMS stator current and resistance of that stator winding.

6. The method in accordance with claim 1, further comprising the step of:

derating the torque command in response to the first estimated stator winding temperature of one or more of the stator windings.

7. The method in accordance with claim 1, further comprising the step of:

estimating, when motor speed is less than the speed threshold, second estimated stator winding temperatures for each of the plurality of stator windings, wherein the second estimated stator winding temperatures are estimated based on the stator winding power loss and a second thermal impedance model that comprises of a $2^{nd}$-order thermal impedance model between the stator winding and a thermal neutral and a $1^{st}$-order thermal impedance model between the thermal neutral and the motor coolant.

8. A method for controlling a torque command in a vector controlled motor drive system, the method comprising the steps of:

determining whether a motor speed is greater than a speed threshold;

estimating, when the motor speed is greater than the speed threshold, a stator winding temperature for each of a plurality stator windings based on a total power loss, wherein the total power loss comprises stator winding power loss and a core power loss; and derating the torque command in response to the estimated stator winding temperature of one or more of the stator windings.

9. A method comprising:

determining a stator winding resistance for each stator winding of a motor based on a temperature of that stator winding and a temperature coefficient of resistance of that stator winding;

determining a stator winding power loss for each phase based on the stator winding resistance for that stator winding;

determining total power loss in each phase based on said stator winding power loss for each phase and a core power loss;

determining a phase temperature change for each phase based on said total power loss, motor speed, and a combined thermal impedance model for that phase; and estimating a stator winding temperature for each of the stator windings based on said phase temperature change for that phase and a motor coolant temperature.

10. The method according to claim 9, wherein said combined thermal impedance model comprises a combined thermal impedance for each phase, wherein said combined thermal impedance for each phase is based on a first thermal impedance between the stator winding and a stator core and a second thermal impedance between the stator core and motor coolant.

11. The method of claim 10, wherein said stator winding power loss determined based on a stator winding resistance for that phase and a root mean square (RMS) stator current of that phase.

12. The method according to claim 9, wherein said core power loss in each phase is determined based on motor speed, stator winding current, and DC bus voltage.

13. The method according to claim 12, wherein said core power loss in each phase is determined by:

providing a plurality of lookup tables, wherein each lookup table corresponds to a particular DC bus voltage, and specifies values of core power loss for different combinations of motor speed and root-mean-square (RMS) stator winding current;

selecting two lookup tables from the plurality of lookup tables based on a DC bus voltage input;

inputting the motor speed and the stator winding current into a first one of the selected lookup tables to compute a first core power loss value;

inputting the motor speed and the stator winding current into a second one of the selected lookup tables to compute a second core power loss value; and performing an interpolation based on the DC bus voltage, the first core power loss value, and the second core power loss value to compute the core power loss.

* * * * *